(12) United States Patent
Tasaka et al.

(10) Patent No.: US 6,515,477 B1
(45) Date of Patent: Feb. 4, 2003

(54) MAGNETIC RESONANCE RANDOM TRAJECTORY COLLECTION METHOD AND APPARATUS

(75) Inventors: Nobuyuki Tasaka, Tokyo (JP); Tetsuji Tsukamoto, Tokyo (JP)

(73) Assignee: Ge Yokogawa Medical Systems, Limited, Tokyo (JP)

( * ) Notice: Subject to any disclaimer, the term of this patent is extended or adjusted under 35 U.S.C. 154(b) by 65 days.

(21) Appl. No.: 09/589,468

(22) Filed: Jun. 7, 2000

(30) Foreign Application Priority Data

Aug. 13, 1999 (JP) ............................................ 11-229092

(51) Int. Cl.[7] ................................................. G01V 3/00
(52) U.S. Cl. ........................ 324/309; 324/307; 324/306; 600/419
(58) Field of Search ......................... 600/419; 324/306, 324/307, 309, 300, 318, 322, 303

(56) References Cited

U.S. PATENT DOCUMENTS 6,188,922 B1 * 2/2001 Mistretta et al. ............ 600/419
6,215,306 B1 * 4/2001 Tsai et al. .................... 324/309
6,222,365 B1 * 4/2001 Taniguchi et al. ........... 324/309
6,400,152 B1 * 6/2002 Cline et al. .................. 324/309

FOREIGN PATENT DOCUMENTS

EP 1079237 A2 * 2/2001

OTHER PUBLICATIONS

Bushong, Stewart C. "Magnetic Resonance Imaging Physical and Biological Principles" Second Edition 1996 textbook published by Mosby–Year Book, Inc. pp. 203–205.*
Sersa et al., Article "Excitation of Arbitrary Shapes by Gradient Optimized Random Walk in Discrete k–Space" Magnetic Resonance In Medicine, vol. 37, No. 6 pp. 920–931 (Jun.) 1997.*
Mason et al., Article "A Method to Measure Arbitrary k–space Trajectories for Rapid MR Imaging" Magnetic Resonance Medicine vol. 38 pp. 492–496 1997.*

* cited by examiner

Primary Examiner—Edward Lefkowitz
Assistant Examiner—Tiffany A. Fetzner
(74) Attorney, Agent, or Firm—Moonray Kojima

(57) ABSTRACT

In order to provide a magnetic resonance signal collection method and apparatus that suppress false images caused by motion of an imaged object, the order of selecting trajectories a–p is randomized. Alternatively, the angular difference is set at 90° between first and next trajectories, and then new trajectories are defined so that the angular difference between adjacent trajectories is a repeatedly bisected angle in sequence.

15 Claims, 17 Drawing Sheets

MAGNETIC RESONANCE RANDOM TRAJECTORY COLLECTION METHOD AND APPARATUS

BACKGROUND OF THE INVENTION

The present invention relates to a magnetic resonance signal collection method and apparatus and a magnetic resonance imaging apparatus, and more particularly to a method and apparatus for successively collecting magnetic resonance signals along a plurality of radial trajectories that pass through the center of a k-space, and a magnetic resonance imaging apparatus that employs such a magnetic resonance signal collection apparatus.

Magnetic resonance imaging by radial scanning involves, as exemplarily shown in FIG. 1, collecting a magnetic resonance signal of an imaged object along each of a plurality of radial trajectories passing through the center of a k-space, or a frequency space, performing one-dimensional inverse Fourier transformation on the magnetic resonance signal for each trajectory to generate projections in a plurality of directions of the imaged object, and back-projecting the projections to reconstruct a tomographic image.

To form the radial trajectories, a gradient magnetic field for reading out the magnetic resonance signals is generated by a vector sum of two gradient magnetic field components whose gradient directions are orthogonal to each other. By generating the two gradient magnetic field components using the sine ($\sin \theta$) and cosine ($\cos \theta$) of the trajectory angle $\theta$, the radial trajectories passing through the center of the k-space are formed.

Since all the trajectories pass through the center of the k-space, the time difference is small among data that relate to generation of a substantial portion of a reconstructed image. Thus, radial scanning is suitable for imaging motion of a moving imaged object with good temporal resolution.

Radial scanning includes sequential scanning and interleaved scanning. Assuming that k-space data are to be collected using eight trajectories, sequential scanning collects the data in the order of a sequence of trajectories 1 through 8 having an angle $\theta$ sequentially increasing counterclockwise, as exemplarily shown in FIG. 2, to collect the data of all the trajectories during a round.

On the other hand, interleaved scanning collects, for example, the data along odd-numbered trajectories 1, 3, 5 and 7 during a first round, and collects the data along even-numbered trajectories 2, 4, 6 and 8 during a second round, as shown in FIGS. 3 and 4, respectively. The trajectories in the second round are interleaved with those in the first round and all data are completed by the data collection over the two rounds.

Sequential scanning exhibits a large time difference between the first and last trajectories, giving rise to false images such as streaking artifacts in the reconstructed image due to inconsistency between the data of those trajectories in a moving imaged object.

Interleaved scanning has a smaller number of trajectories per round, i.e., a smaller factor value, and therefore the time difference is decreased between the first and last trajectories in each round, reducing false images. However, since there remains a sequential characteristic within each round, scan conditions must be adjusted such as by modifying the factor value according to the motion velocity to effectively reduce the false images.

SUMMARY OF THE INVENTION

It is an object of the present invention to provide a magnetic resonance signal collection method and apparatus that suppress false images caused by motion of an imaged object, and a magnetic resonance imaging apparatus that employs such a magnetic resonance signal collection apparatus.

In accordance with a first aspect of the invention, there is provided a magnetic resonance signal collection method for successively collecting magnetic resonance signals along a plurality of radial trajectories passing through the center of a k-space, comprising randomizing the order of selecting the trajectories.

In accordance with a second aspect of the invention, there is provided a magnetic resonance signal collection method for successively collecting magnetic resonance signals along a plurality of radial trajectories passing through the center of a k-space, comprising setting an angular difference between first and next trajectories at 90°, and then defining new trajectories alternately in two adjacent regions formed by dividing the k-space by the first and next trajectories so that the angular difference between adjacent trajectories is a repeatedly bisected angle in sequence.

In accordance with a third aspect of the invention, there is provided a magnetic resonance signal collection apparatus for successively collecting magnetic resonance signals along a plurality of radial trajectories passing through the center of a k-space, comprising view control means for randomizing the order of selecting the trajectories.

In accordance with a fourth aspect of the invention, there is provided a magnetic resonance signal collection apparatus for successively collecting magnetic resonance signals along a plurality of radial trajectories passing through the center of a k-space, comprising view control means for setting an angular difference between first and next trajectories at 90°, and then defining new trajectories alternately in two adjacent regions formed by dividing the k-space by the first and next trajectories so that the angular difference between adjacent trajectories is a repeatedly bisected angle in sequence.

EFFECT

According to the present invention, the order of selecting trajectories is randomized. Alternatively, the angular difference between first and next trajectories is set at 90°, and then new trajectories are defined alternately in two adjacent regions formed by dividing the k-space by the first and next trajectories so that the angular difference between adjacent trajectories is a repeatedly bisected angle in sequence. Thus, the sequential characteristic of trajectories is eliminated, thereby reducing inconsistency in data between the trajectories caused by motion of an imaged object.

Therefore, the present invention can provide a magnetic resonance signal collection method and apparatus that suppress false images caused by motion of an imaged object, and a magnetic resonance imaging apparatus that employs such a magnetic resonance signal collection apparatus.

Further objects and advantages of the present invention will be apparent from the following description of the preferred embodiments of the invention as illustrated in the accompanying drawings.

DETAILED DESCRIPTION OF THE INVENTION

Figure 1:
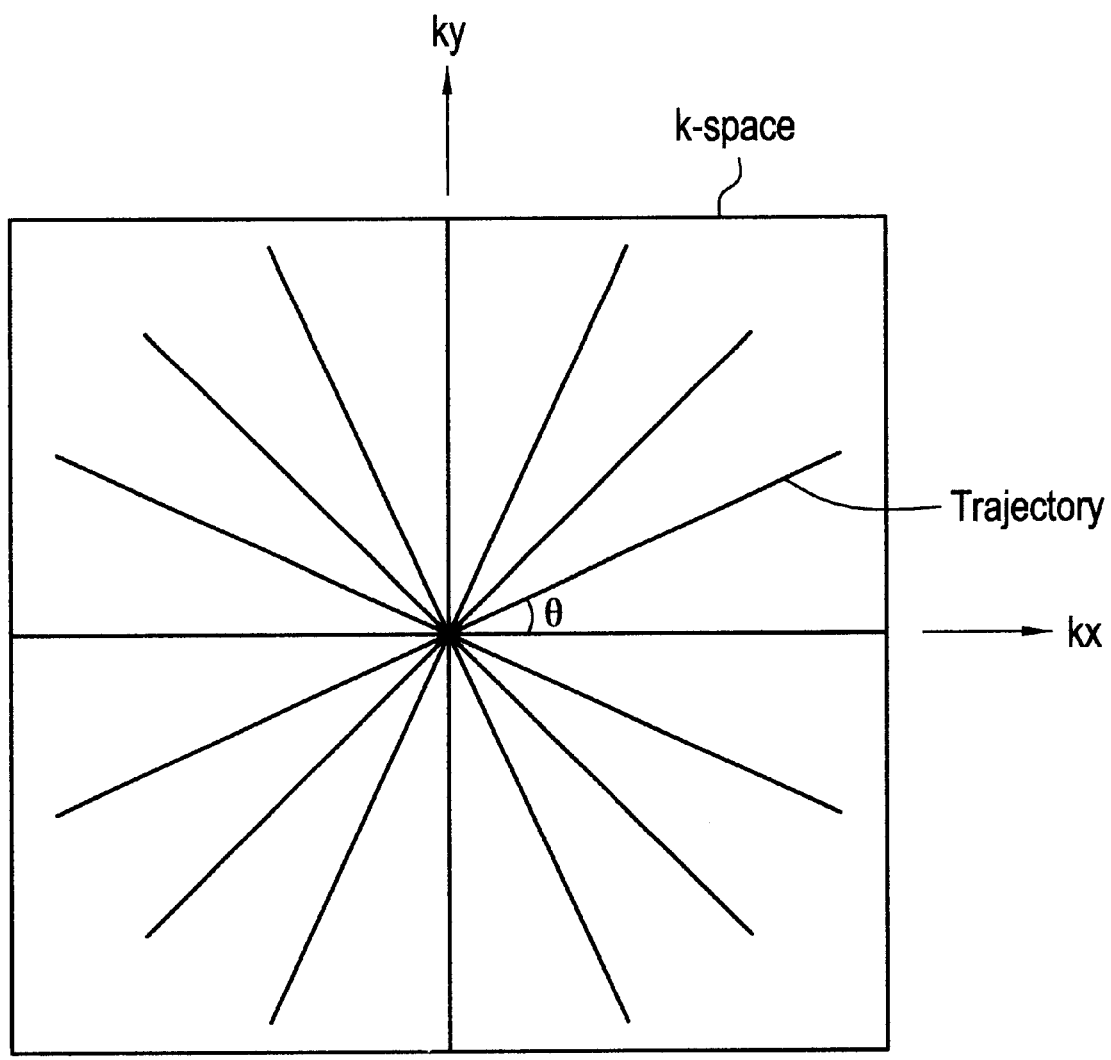
FIG. 1 illustrates exemplary trajectories for data collection by radial scanning.
Figure 2:
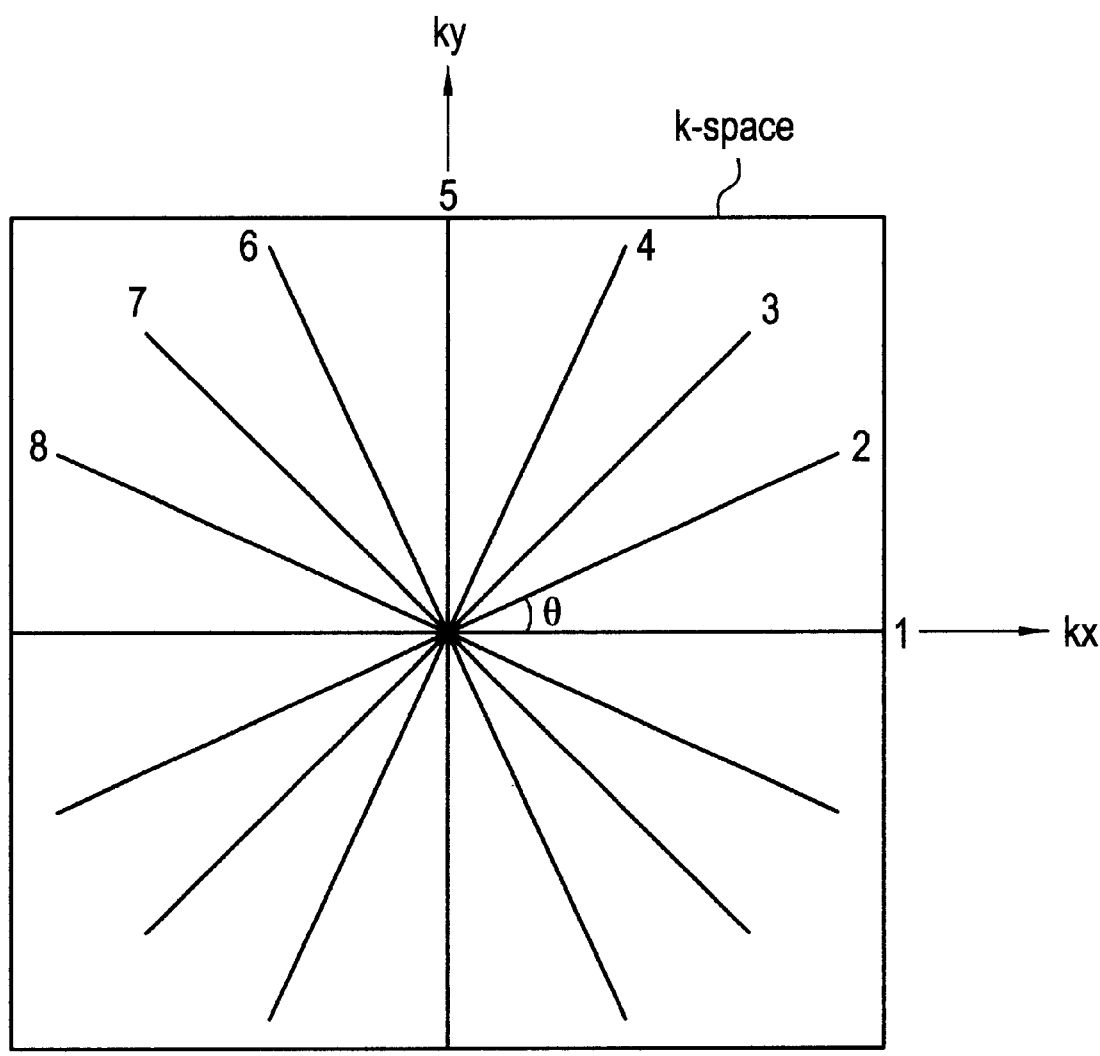
FIG. 2 illustrates exemplary trajectories for sequential data collection by radial scanning.
Figure 3:
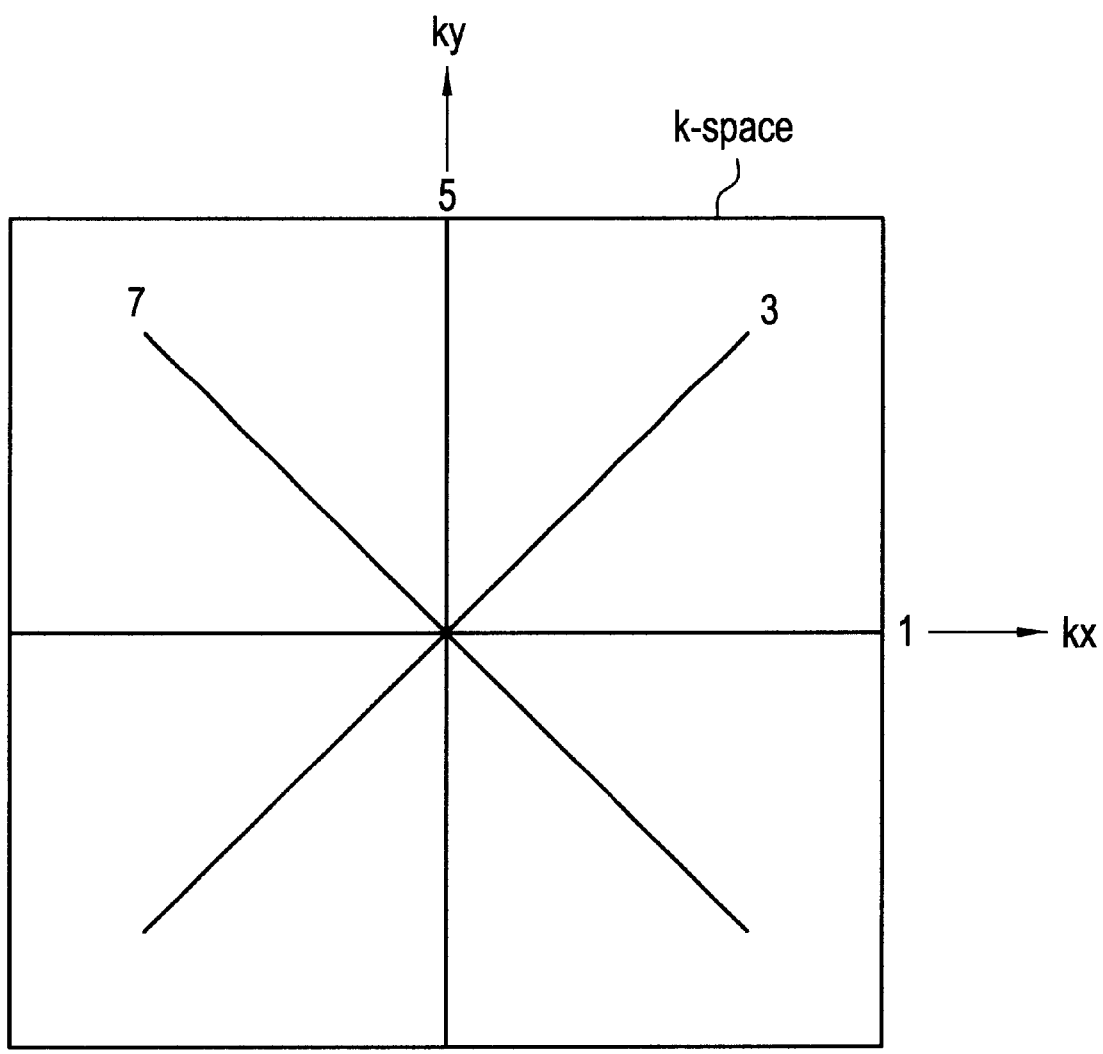
FIGS. 3 and 4 illustrate exemplary trajectories for interleaved data collection by radial scanning.
Figure 4:
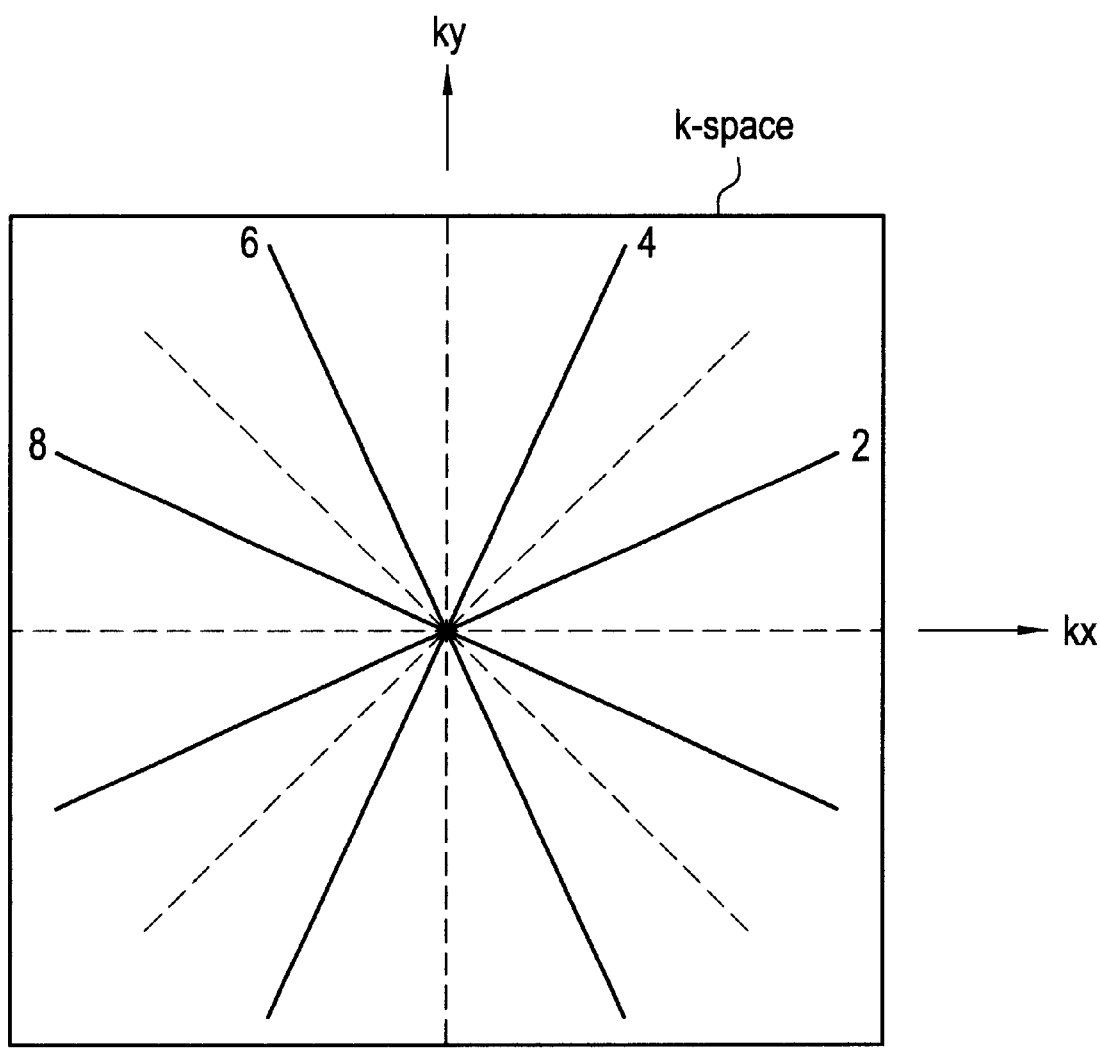
Figure 5:
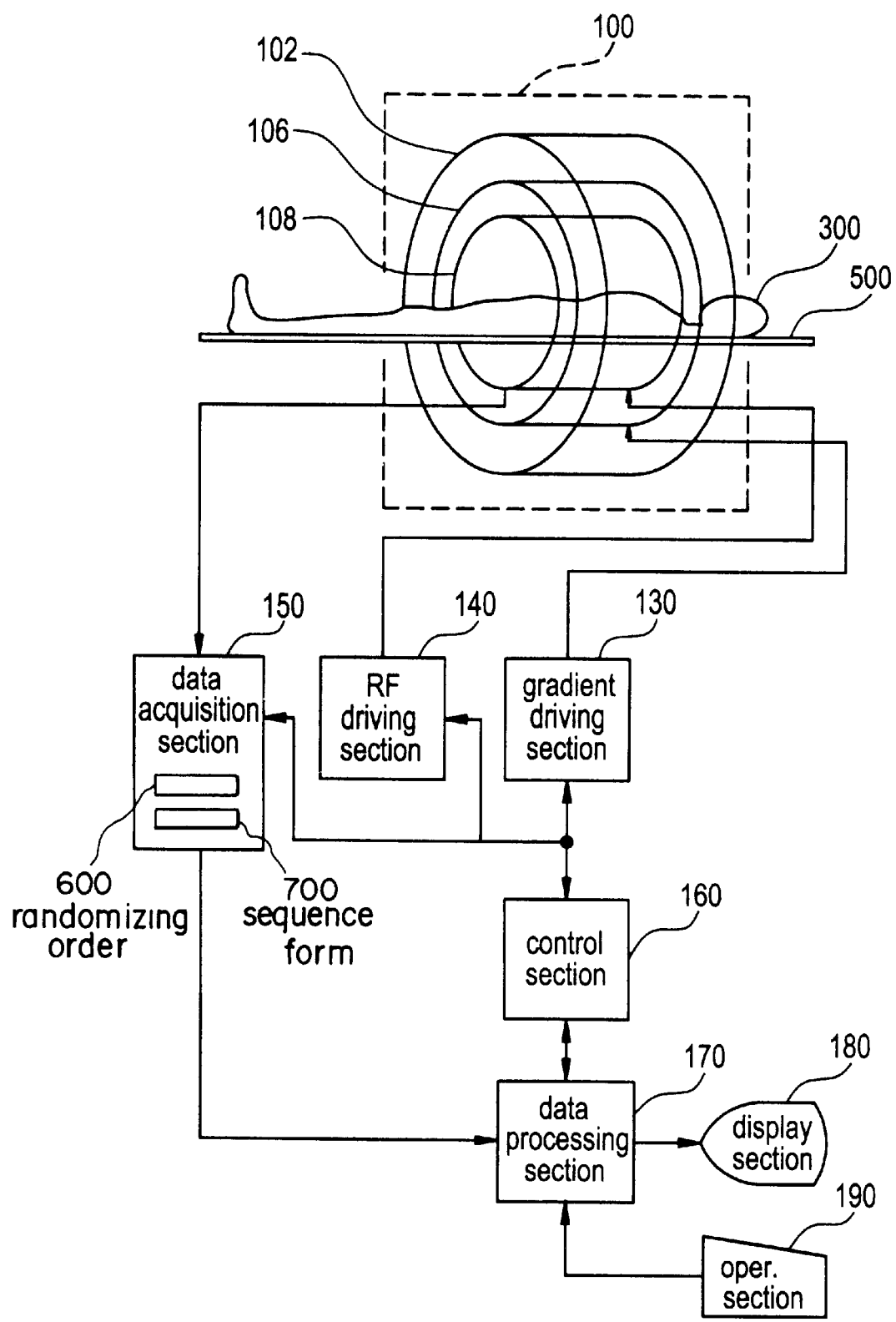
FIG. 5 is a block diagram of an apparatus in accordance with an embodiment of the present invention.

Several embodiments of the present invention will now be described in more detail with reference to the accompanying drawings. FIG. 5 shows a block diagram of a magnetic resonance imaging apparatus, which is an embodiment of the present invention. The configuration of the apparatus represents an embodiment of the apparatus in accordance with the present invention, and the operation of the apparatus represents an embodiment of the method in accordance with the present invention.

The configuration of the apparatus will be now described. As shown in FIG. 5, the present apparatus has a magnet system 100. The magnet system 100 has a main magnetic field coil section 102, a gradient coil section 106 and an RF (radio frequency) coil section 108. These coil sections have a generally cylindrical outer shape and are concentrically disposed. An imaged object 300 is rested on a cradle 500 and carried into and out of the internal space of the magnet system 100 by carrier means (not shown). The imaged object 300 is a subject of "motion kinematic imaging" for imaging the state of an elbow joint or the like during flexing motion, for example.

The main magnetic field coil section 102 generates a static magnetic field in the internal space of the magnet system 100. The direction of the static magnetic field is generally in parallel with the body axis of the imaged object 300, i.e., a "horizontal" magnetic field is generated. The main magnetic field coil section 102 is made using a superconductive coil, for example. It will be easily recognized that the main magnetic field coil section 102 is not limited to a superconductive coil, but may be made using a normal conductive coil or the like.

The gradient coil section 106 generates gradient magnetic fields for imparting gradients to the static magnet field strength. The gradient magnetic fields to be generated include a slice gradient magnetic field and two readout gradient magnetic fields. The two readout gradient magnetic fields have respective gradients lying in directions orthogonal to each other. The gradient coil section 106 has three gradient coils (not shown) corresponding to these three gradient magnetic fields. A gradient magnetic field is referred to simply as a gradient hereinbelow.

The RF coil section 108 generates a high frequency magnetic field in the static magnetic field space to excite spins within the imaged object 300. The generation of the high frequency magnetic field will be referred to as transmission of an RF excitation signal hereinbelow. The RF coil section 108 also receives an electromagnetic wave generated by the excited spins, i.e., a magnetic resonance signal. The RF coil section 108 has a transmit coil and a receive coil (not shown). The transmit and receive coils are either the same coil or separate dedicated coils.

The gradient coil section 106 is connected with a gradient driving section 130 for supplying driving signals to the gradient coil section 106 to generate the gradient magnetic fields. The gradient driving section 130 has three driving circuits (not shown) corresponding to the three gradient coils in the gradient coil section 106.

The RF coil section 108 is connected with an RF driving section 140 for supplying driving signals to the RF coil section 108 to transmit the RF excitation signals, thereby exciting the spins within the imaged object 300.

The RF coil section 108 is also connected with a data acquisition section 150 for gathering signals received by the RF coil section 108 and acquiring the signals as digital data.

The gradient driving section 130, RF driving section 140 and data acquisition section 150 are connected with a control section 160 for controlling these sections 130–150.

A portion consisting of the main magnetic field coil section 102, gradient coil section 106, gradient driving section 130, RF coil section 108, data acquisition section 150 and control section 160 represents an embodiment of the magnetic resonance signal collection apparatus of the present invention. The configuration of the apparatus represents an embodiment of the apparatus in accordance with the present invention, and the operation of the apparatus represents an embodiment of the method in accordance with the present invention.

The portion consisting of the main magnetic field coil section 102, gradient coil section 106, gradient driving section 130, RF coil section 108, data acquisition section 150 and control section 160 also represents an embodiment of the signal collection means of the present invention. The control section 160 is an embodiment of the view control means of the present invention.

The data acquisition section 150 is connected to a data processing section 170. The data processing section 170 stores data gathered from the data acquisition section 150 in a memory (not shown). The data processing section 170 reconstructs a tomographic image of the imaged object 300 using the data stored in the memory. The data processing section 170 is an embodiment of the image producing means of the present invention.

The data processing section 170 is connected to the control section 160. The data processing section 170 is superordinate to the control section 160 and governs the section 160. The data processing section 170 is connected with a display section 180 that displays the reconstructed image and several kinds of information output from the data processing section 170, and an operating section 190 that is operated by a human operator and inputs several commands, information and so forth to the data processing section 170.

Figure 6:
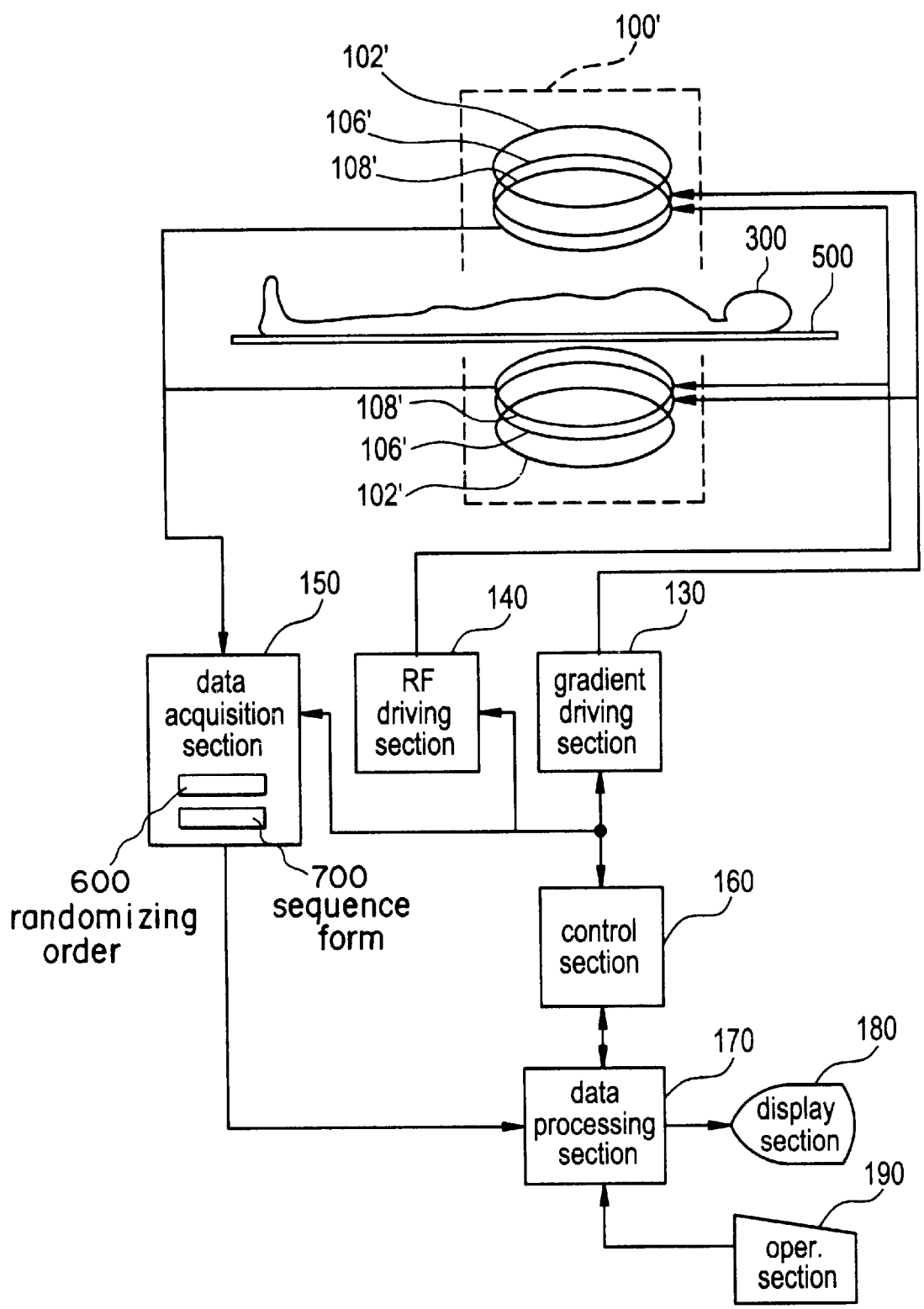
FIG. 6 is a block diagram of an apparatus in accordance with another embodiment of the present invention.

FIG. 6 shows a block diagram of another magnetic resonance imaging apparatus, which is an embodiment of the present invention. The configuration of the apparatus represents an embodiment of the apparatus in accordance with the present invention, and the operation of the apparatus represents an embodiment of the method in accordance with the present invention.

The apparatus shown in FIG. 6 has a different magnet system 100' from the apparatus shown in FIG. 5. Components other than the magnet system 100' are configured in a similar manner to those in the apparatus shown in FIG. 5, and similar parts are designated by similar reference numerals and explanation thereof will be omitted.

The magnet system 100' has a main magnetic field magnet section 102', a gradient coil section 106' and an RF coil section 108'. The main magnetic field magnet section 102' and the coil sections 106' and 108' each comprises a pair of members facing each other across a space. These sections have a generally disk-like outer shape and are disposed to have a common center axis. The imaged object 300 is rested on the cradle 500 and carried into and out of the internal space of the magnet system 100' by carrier means (not shown).

The main magnetic field magnet section 102' generates a static magnetic field in the internal space of the magnet system 100'. The direction of the static magnetic field is generally orthogonal to the direction of the body axis of the imaged object 300, i.e., a "vertical" magnetic field is generated. The main magnetic field magnet section 102' is made using a permanent magnet, for example. It will be easily recognized that the main magnetic field magnet section 102' is not limited to a permanent magnet, but may be made using a superconductive or normal conductive electromagnet, etc.

The gradient coil section 106' generates gradient magnetic fields for imparting gradients to the static magnet field strength. The gradient magnetic fields to be generated include a slice gradient magnetic field and two readout gradient magnetic fields. The two readout gradient magnetic fields have respective gradients lying in directions orthogonal to each other. The gradient coil section 106' has three gradient coils (not shown) corresponding to these three gradient magnetic fields.

The RF coil section 108' transmits an RF excitation signal to the static magnetic field space to excite spins within the imaged object 300. The RF coil section 108' also receives a magnetic resonance signal generated by the excited spins. The RF coil section 108' has a transmit coil and a receive coil (not shown). The transmit and receive coils are either the same coil or separate dedicated coils.

The operation of the present apparatus will now be described. The apparatus shown in FIG. 5 and that shown in FIG. 6 are identical in operation. FIGS. 7(A)–7(E) show an exemplary pulse sequence for use in magnetic resonance imaging. The illustrated pulse sequence is one for a radial gradient echo (RGRE) technique.

Figure 7:
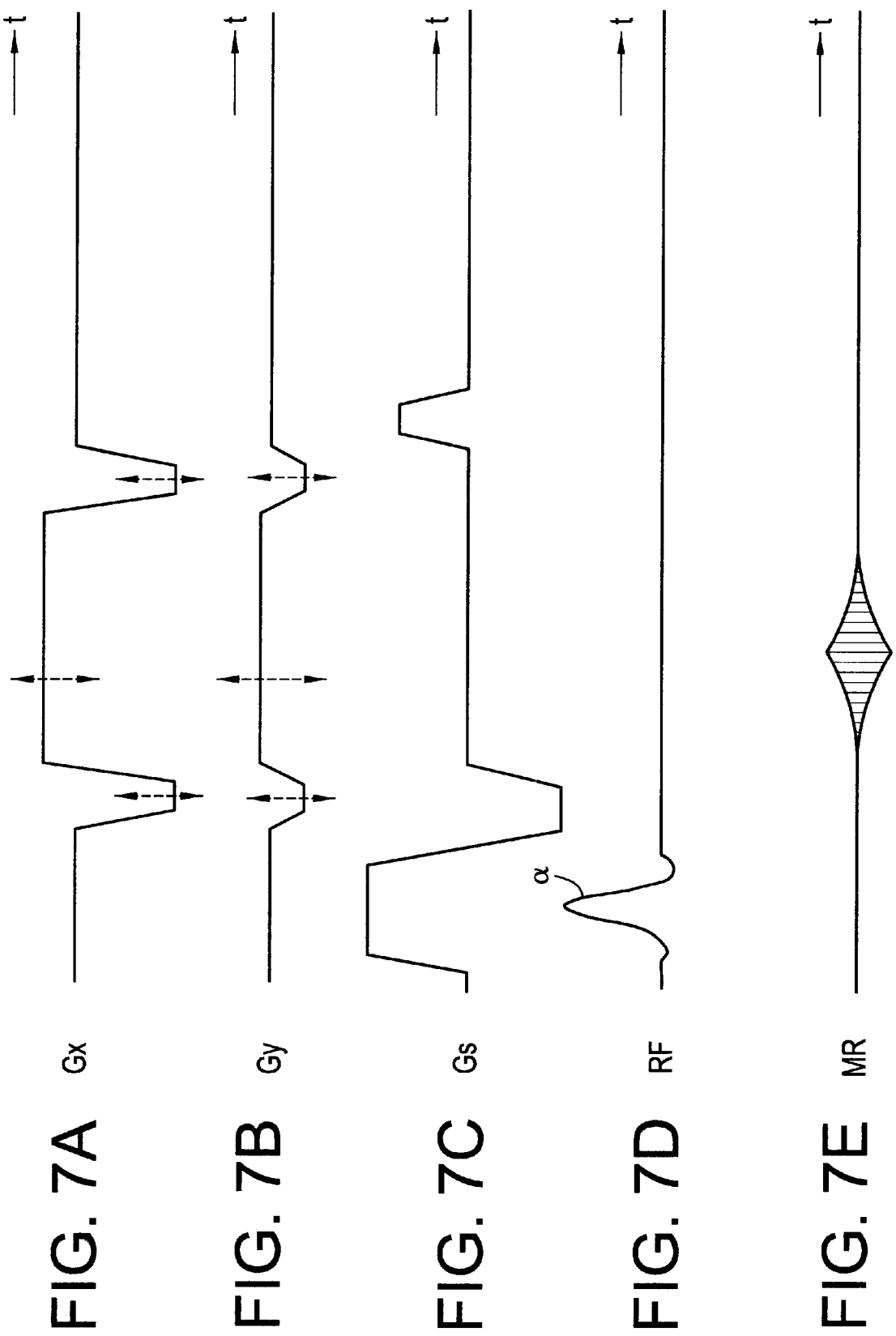
FIGS. 7(A)–7(E) illustrate an exemplary pulse sequence executed by the apparatus shown in FIG. 5 or 6.

Specifically, FIGS. 7(A) and 7(E) are sequences of a pair of readout gradients (radial readout gradients) Gx and Gy of the RGRE technique, and FIGS. 7(C), 7(D) and 7(E) are sequences of a slice gradient Gs, α° pulse for RF excitation and a gradient echo MR, respectively. The pulse sequence proceeds from the left to the right along a time axis t.

As shown, the α° pulse produces α° excitation of the spins. At the same time, the slice gradient Gs is applied to achieve selective excitation for a certain slice. After the α° excitation, the readout gradients Gx and Gy are applied. Thus, the spins are first dephased and are subsequently rephased to generate a gradient echo MR. The gradient echo MR is an RF signal having a symmetric waveform with respect to the echo center. The gradient echo will be referred to simply as an echo hereinbelow.

The echo MR is collected by the data acquisition section 150 as view data. Such a pulse sequence is repeated a number of times needed to obtain data of a scan, for example, 128–256 times, in a cycle of TR.

Figure 8:
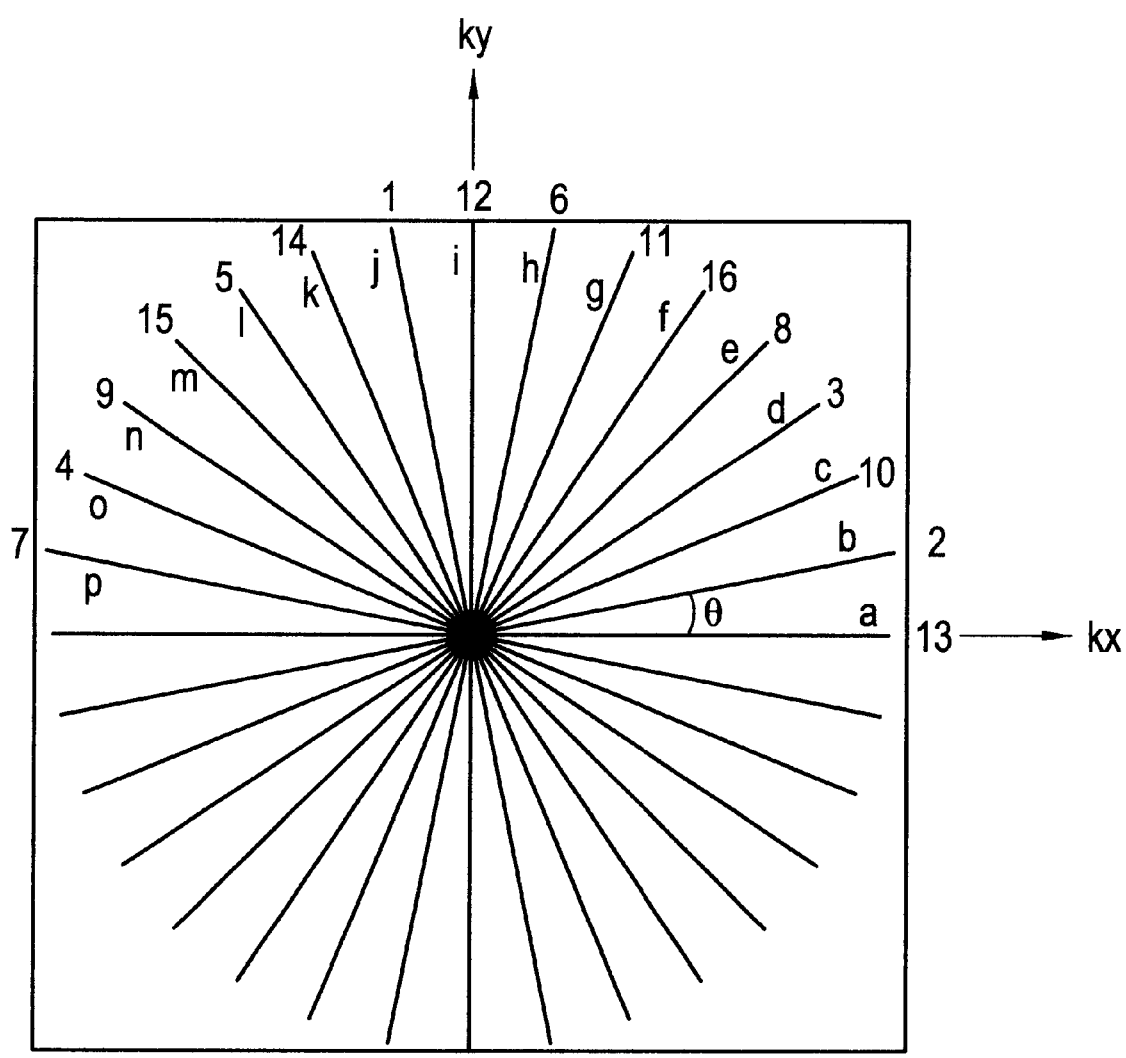
FIG. 8 illustrates exemplary trajectories for data collection by the apparatus shown in FIG. 5 or 6.

The readout gradients Gx and Gy are varied for each repetition to perform a different radial readout each time. Thus, view data are successively obtained along a plurality of radial trajectories passing through the center or a k-space, as exemplarily shown in FIG. 8. It should be noted that for convenience of illustration FIG. 8 illustrates a case in which a scan comprises sixteen views.

As shown, the radial trajectories for a scan comprise sixteen trajectories a–p arranged in order counterclockwise at a constant angular pitch within an angular range of 180° on the k-space. On such trajectories, data collection is performed in random order regardless of the order of the trajectory arrangement.

An described in detail hereinbelow, in FIGS. 5 and 6, Box 600 contained in Box 150, provides data collection in random order regardless of the order of the trajectory arrangement. Box 700 also contained in Box 150, provides radial trajectory formation in sequence.

Specifically, and for example, a first data collection is performed along trajectory j, the next data collection is performed along trajectory b, and following data collections are successively performed respectively along trajectories d, o, l, h, p, e, n, c, g, i, a, k, m and f. Such data collections can be implemented by randomizing the order of varying trajectory angle θ, and generating the readout gradients Gx and Gy using the cosine function (cos θ) and sine function (sin θ) of angle θ, respectively.

By randomizing the order of the trajectories, time phases of motion of the imaged object 300 are randomly distributed over the k-space. Thus, regularity in data associated with the directivity of motion is eliminated among the view data.

The data processing section 170 performs one-dimensional inverse Fourier transformation on such view data to provide projections in a plurality of directions of the imaged object 300 in an actual space, and back-projects the projections to reconstruct a tomographic image. It will be easily recognized that convolution of the projection data is performed by an appropriate kernel in the back projection.

Moreover, the image reconstruction may performed by appropriately filtering the view data in the k-space, and then performing the one-dimensional inverse Fourier transformation on the filtered data and back-projecting them.

It should be noted that the image construction is not limited to back projection, but may be performed by a "gridding" technique. Specifically, an image can be reconstructed by converting the data that are radially arranged in the k-space into a data array arranged in a grid, through interpolation, and performing two-dimensional inverse Fourier transformation on the data in the grid array.

Since no regularity of data owing to motion directivity is present among the projections, data regularity-induced false images such as streaking artifacts are not generated in the image reconstructed via the back projection. Also since no regularity of data owing to motion directivity is present, the false image-avoiding effect is not affected by the motion speed. Accordingly, the need to adjust scan conditions according to the motion speed is eliminated. Thus, a reconstructed image not containing motion-induced false images can be easily obtained. Therefore, a reconstructed image of good quality is displayed on the display section 180.

The order of the trajectories need not always be completely randomized. Instead, false images can be reduced even when a certain degree of regularity is imparted. FIGS. 9–17 show an example of such radial trajectory formation in sequence.

Figure 9:
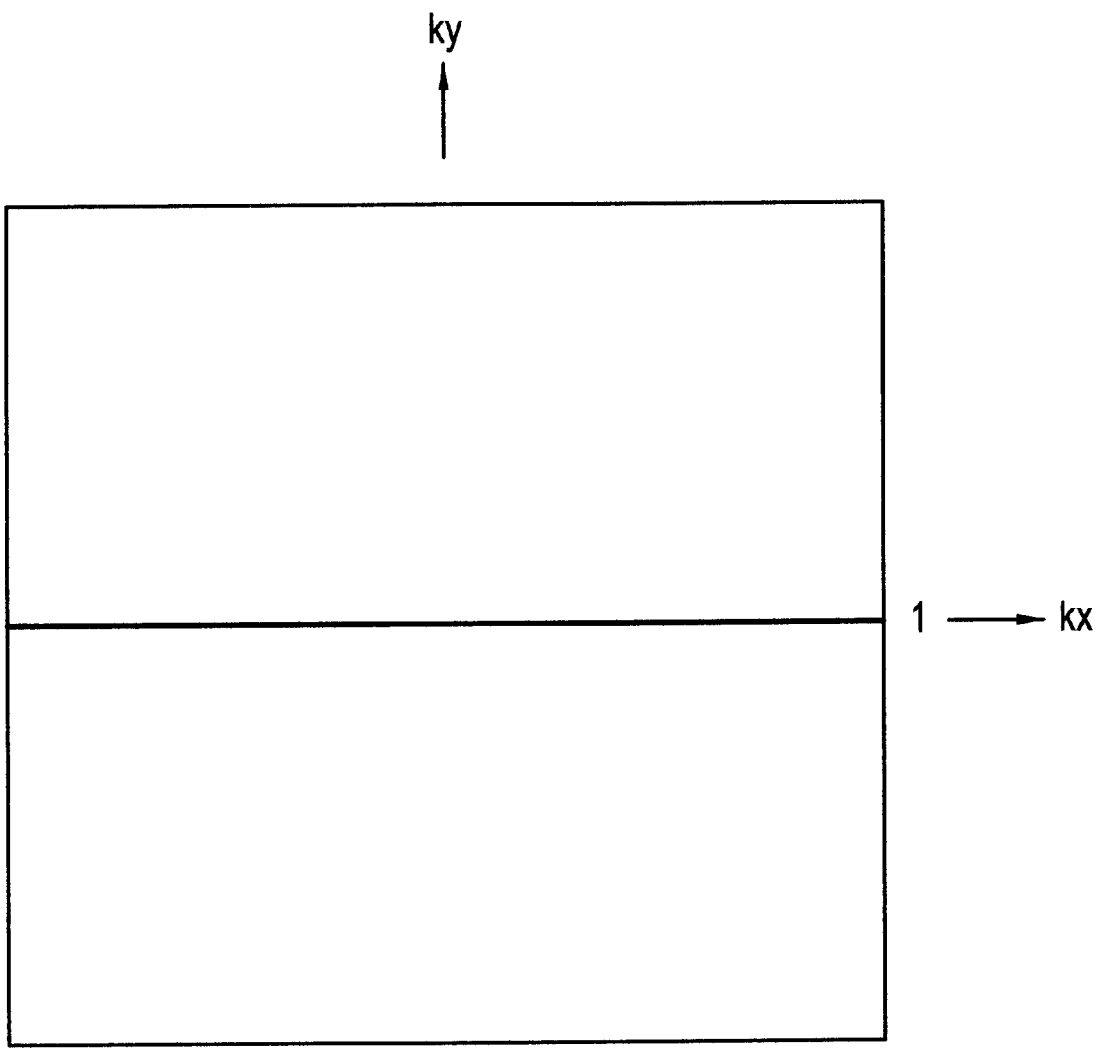
FIGS. 9–17 are diagrams for explanation of trajectory formation by the apparatus shown in FIG. 5 or 6.
Figure 10:
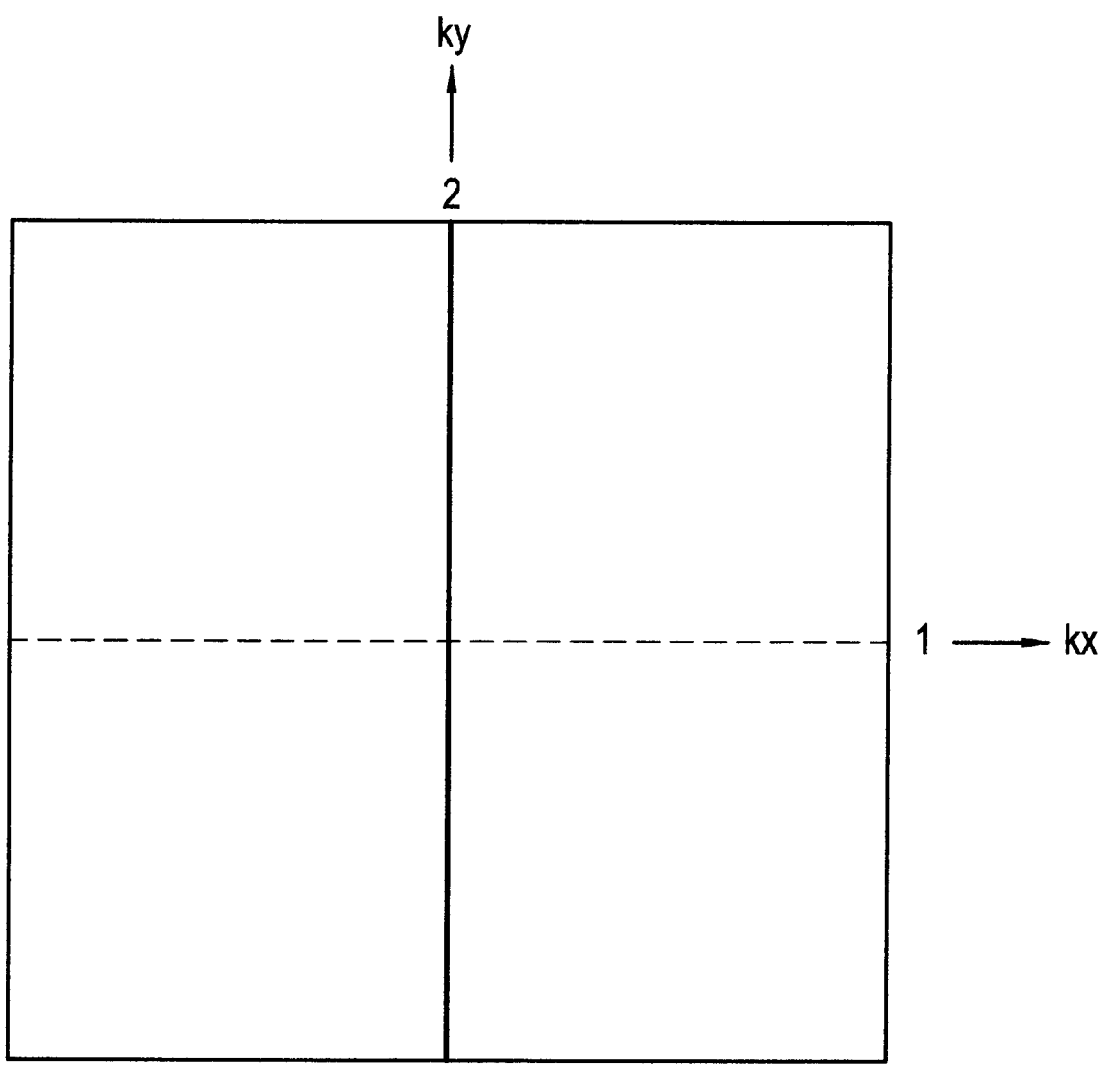
Figure 11:
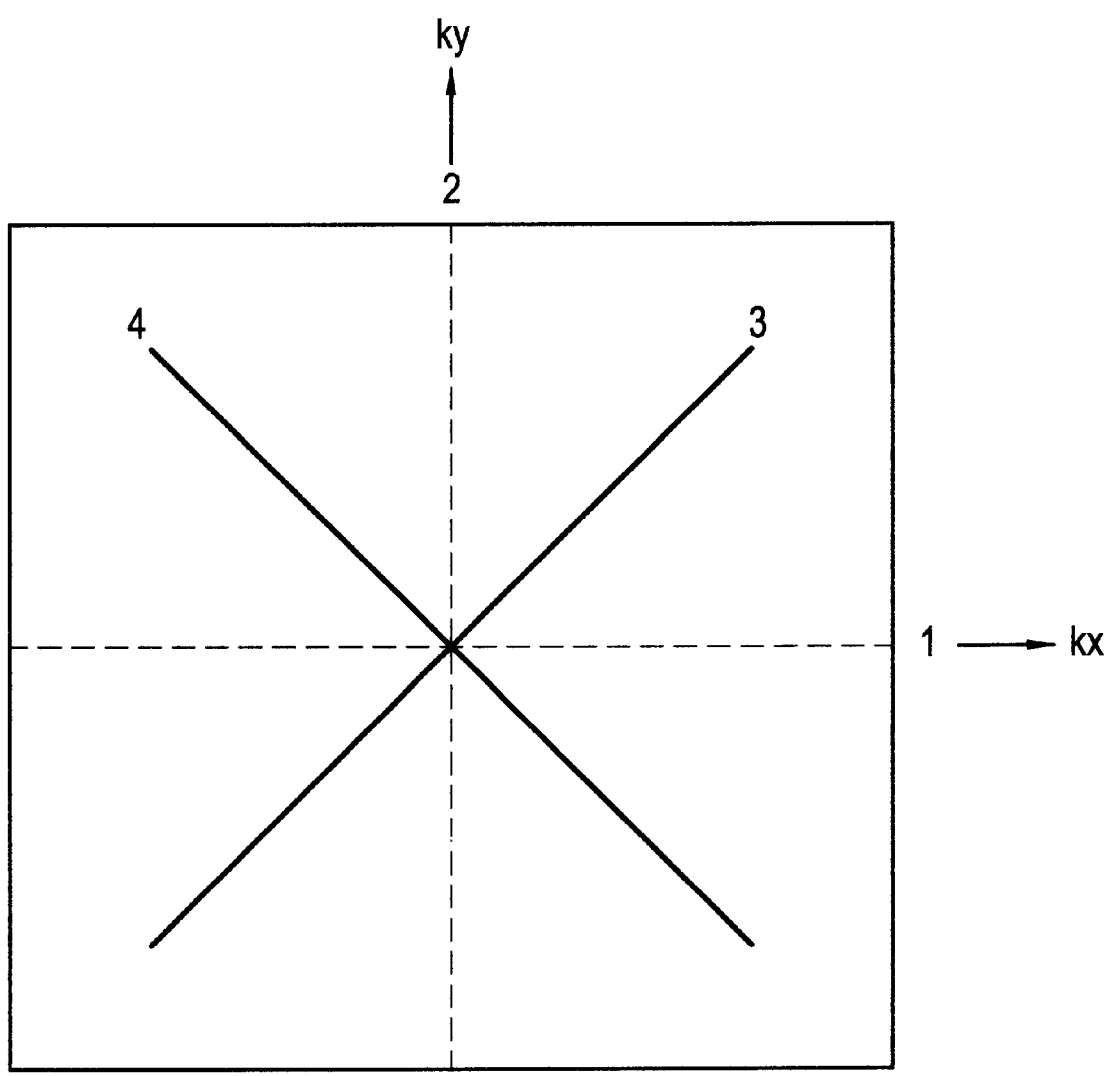

First, data collection is performed on a first trajectory 1 along the kx axis, as shown in FIG. 9. Next, data is collected on a second trajectory 2 along the ky axis, as shown in FIG. 10. The trajectories 1 and 2 are orthogonal to each other, and have an angular difference of π/2. Thus, the k-space is divided into four quadrants. Then, data are collected respectively on trajectories 3 and 4 each of which has a direction bisecting the angular difference π/2 between the trajectories 1 and 2, as shown in FIG. 11. Thus, the angular difference between the trajectories becomes π/4.

Figure 12:
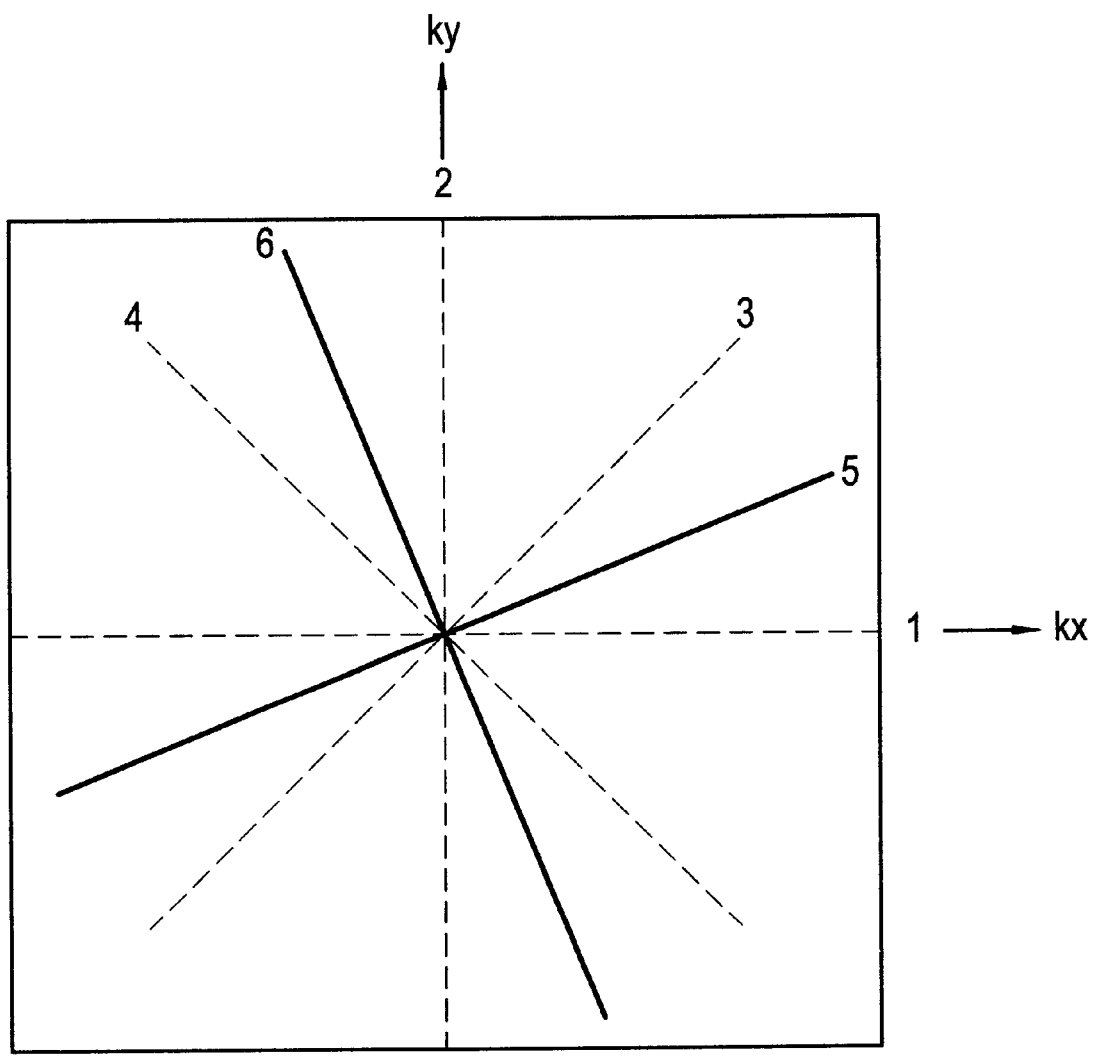
Figure 13:
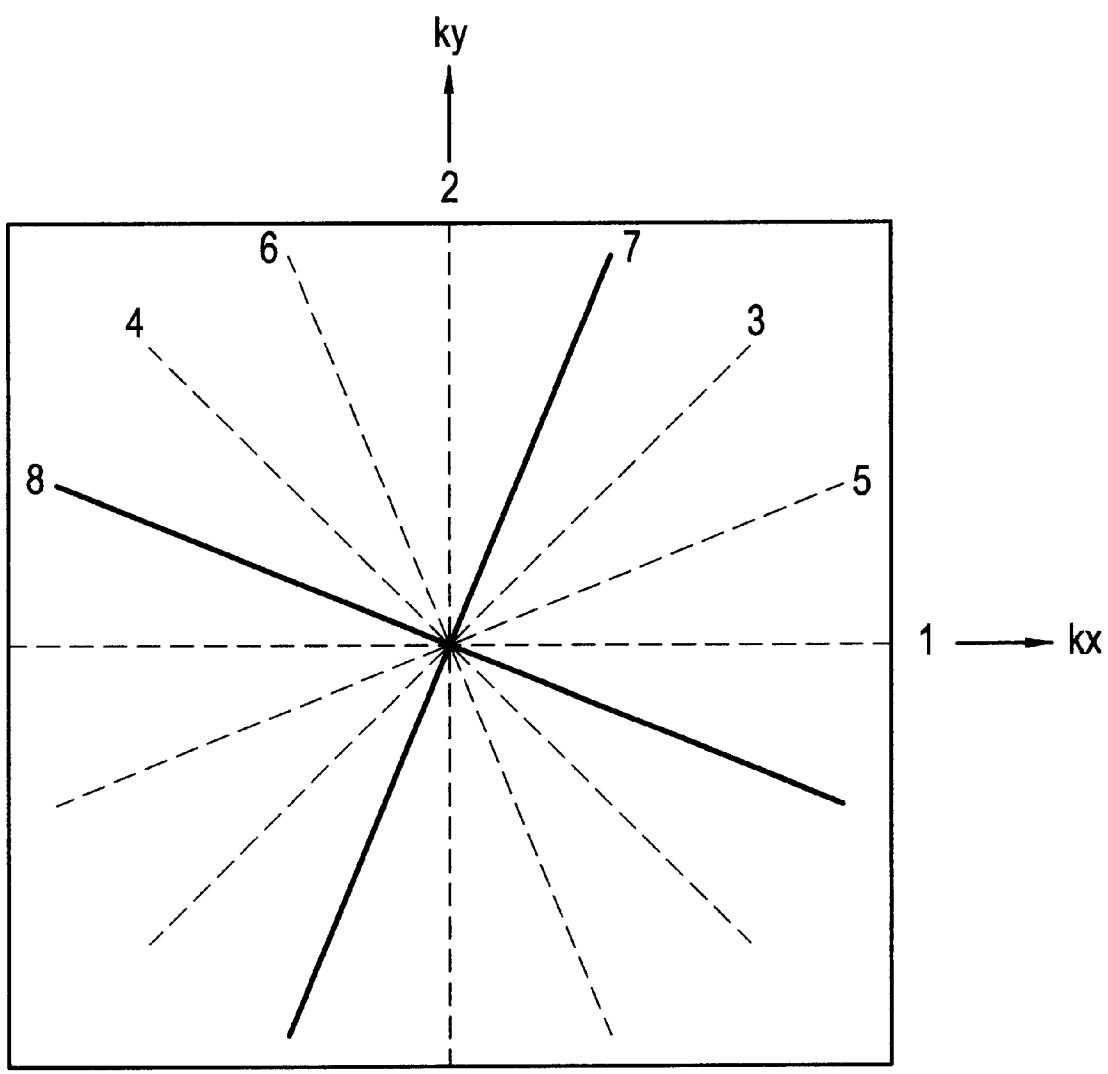

Next, as shown in FIGS. 12 and 13, data collections are performed respectively on trajectories 5, 6, 7 and 8 each of which has a direction further bisecting the angular difference between the trajectories. Thus, the angular difference between the trajectories becomes π/8.

In forming the trajectories 5, 6, 7 and 8, the trajectory 5 is formed in the first and third quadrants, and the trajectory 6 in the second and fourth quadrants. Similarly, the trajectory 7 is formed in the first and third quadrants, and the trajectory 8 in the second and fourth quadrants. That is, trajectories are formed alternately in different quadrants having directions different by π/2.

Figure 14:
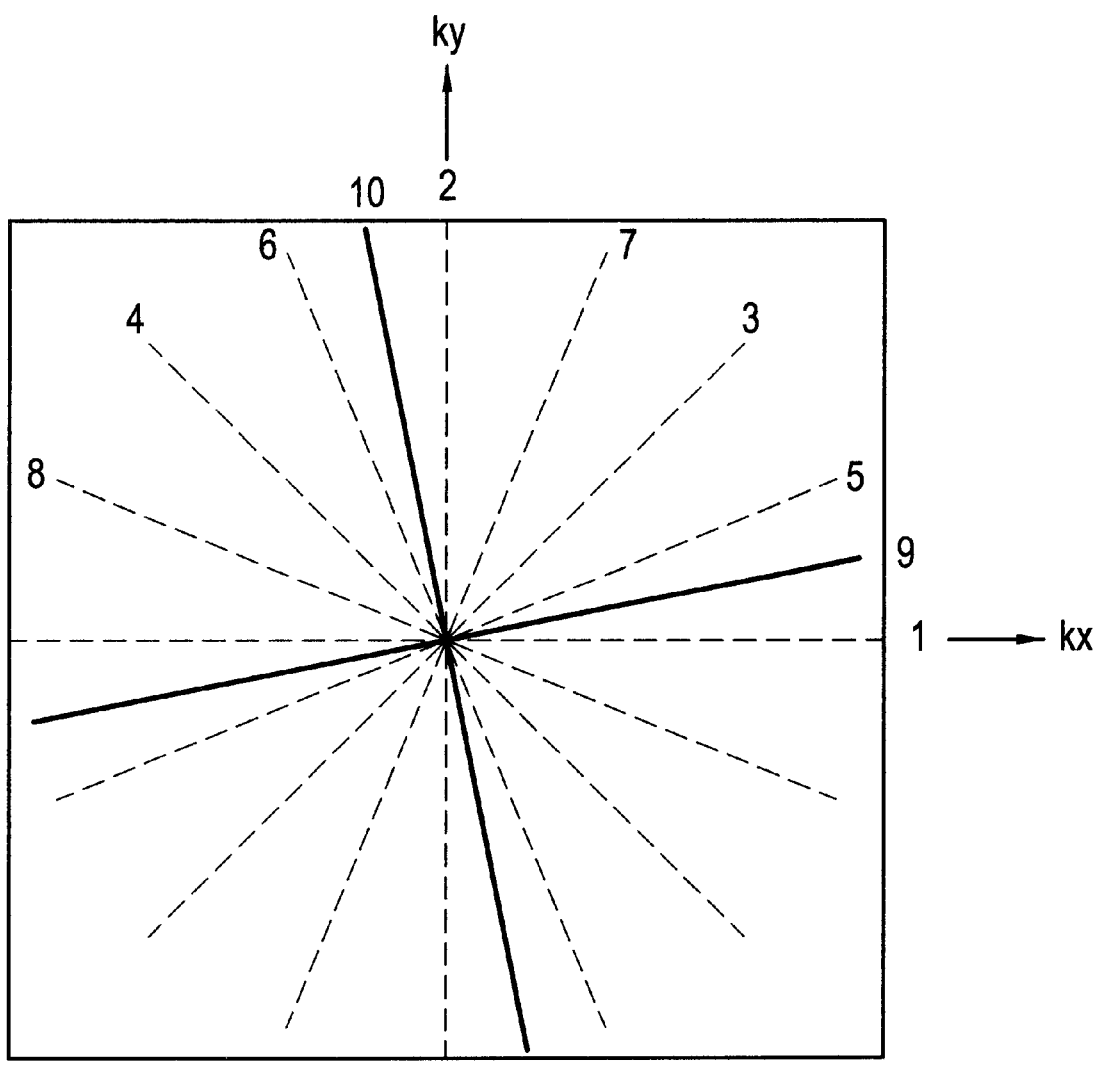
Figure 15:
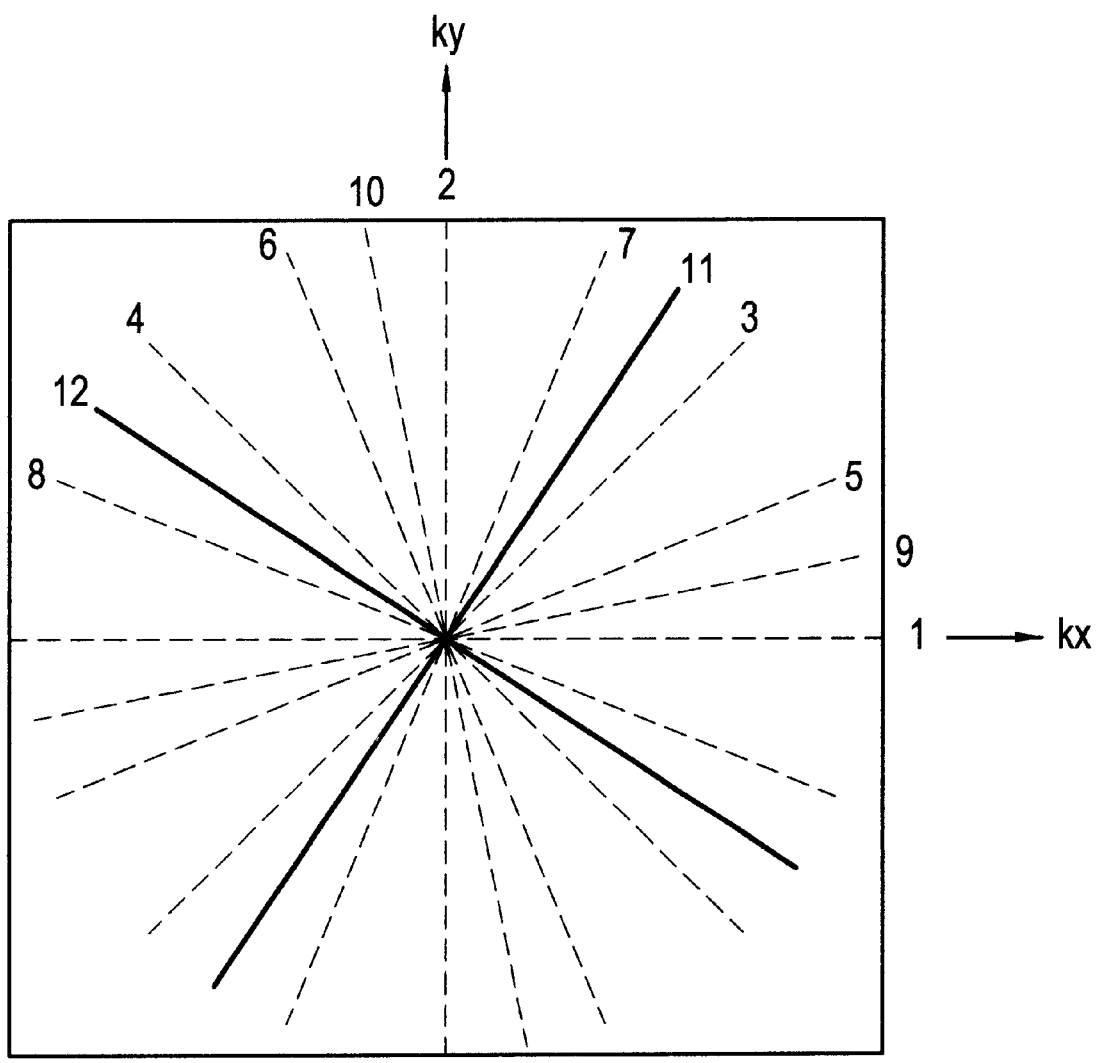
Figure 16:
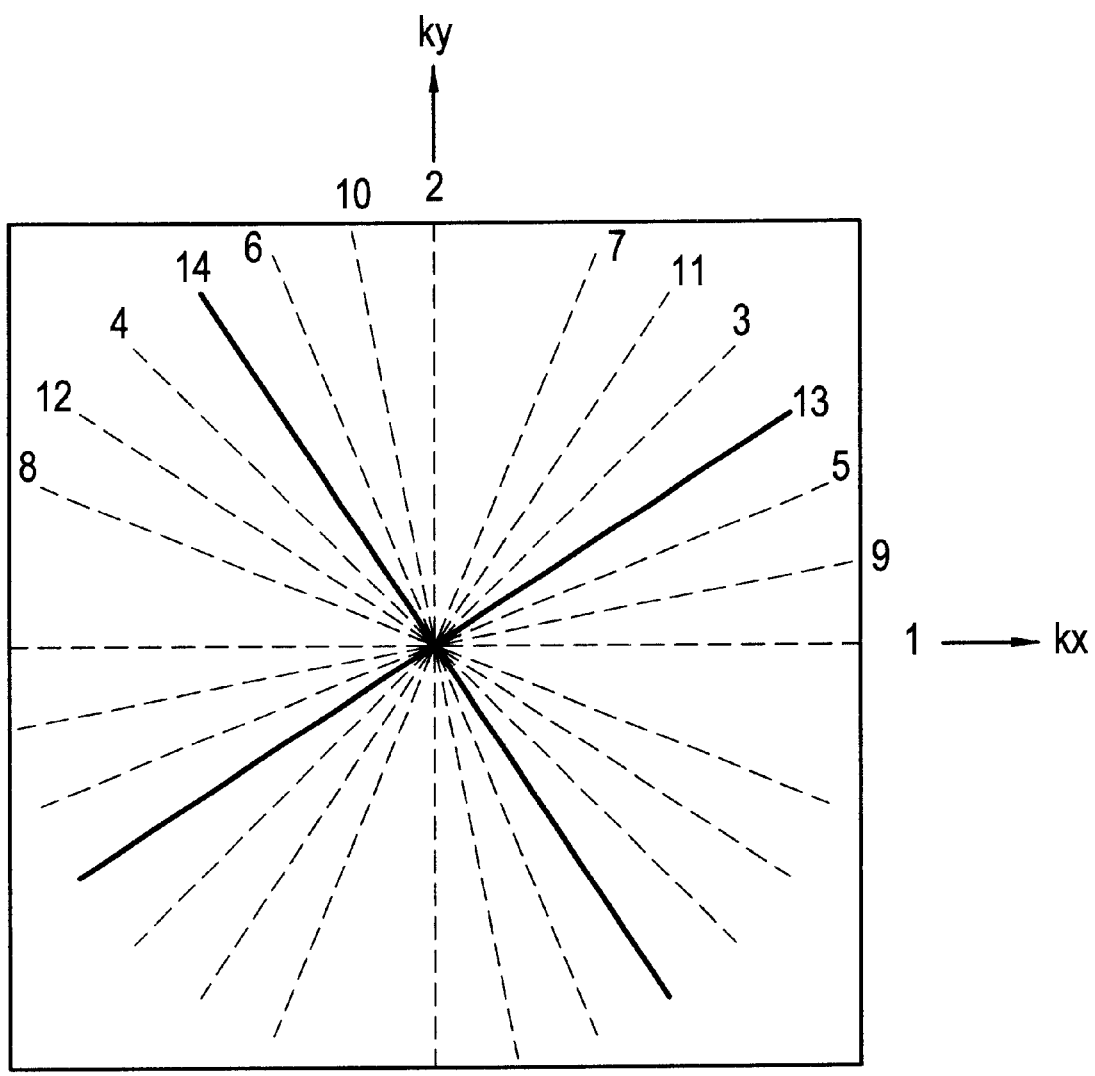
Figure 17:
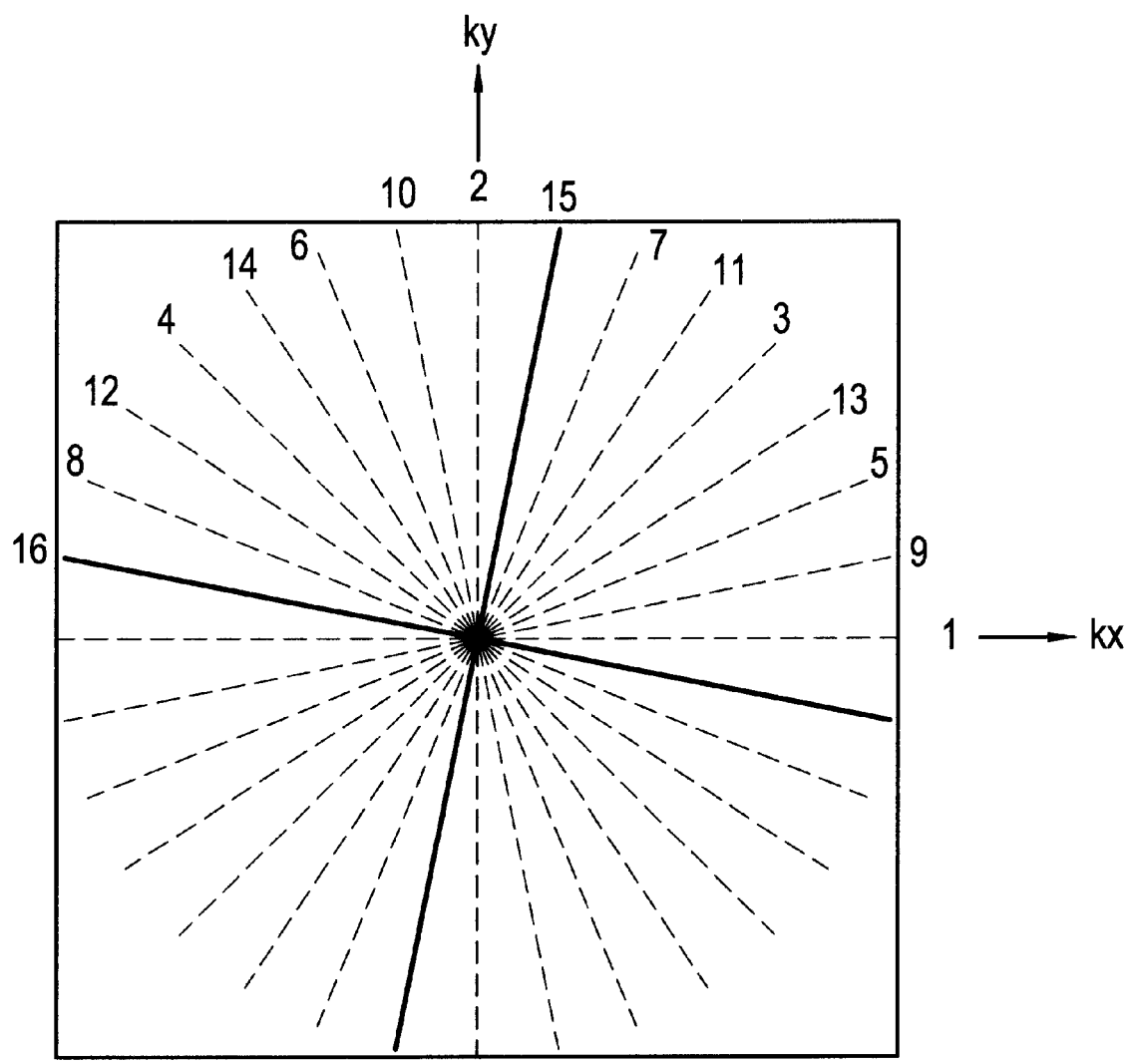

Thereafter, trajectories are sequentially formed in directions repeatedly bisecting the angular difference between the trajectories, in the same manner as above. Specifically, trajectories 9 and 10 are formed as shown in FIG. 14, trajectories 11 and 12 as shown in FIG. 15, trajectories 13 and 14 as shown in FIG. 16, and trajectories 15 and 16 as shown in FIG. 17. Now the angular difference between the trajectories is π/16. The following trajectories are similarly formed.

When such data collection is performed, every trajectory has a different direction than the immediately preceding one by an angle of or near π/2. Thus, time phases of motion of the imaged object 300 are approximately randomly distributed over the k-space. Therefore, regularity among the view data associated with the motion directivity is diluted.

The data processing section 170 reconstructs a tomographic image from these view data in a similar manner as above. Since the regularity in data associated with the directivity of motion is diluted in the projections, false images such as streaking artifacts are reduced in the reconstructed image. Moreover, the false image-avoiding effect does not change with motion speed. Accordingly, the need to adjust scan conditions according to the motion speed is eliminated. That is, a reconstructed image having reduced motion-induced false images can be easily obtained.

While the preceding description is made on a case in which a pulse sequence of the RGRE technique is employed, the pulse sequence is not limited to the RGRE technique, but may be of any other appropriate techniques such as a spin echo (SE) technique or echo-planar imaging (EPI). It will be easily recognized that in either technique, radial readout gradients are employed for reading out echoes.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance signal collection method comprising the steps of:
    successively collecting magnetic resonance signals along a plurality of linear radial trajectories passing through center of a k-space; and
    randomizing order of selecting said trajectories thereby to reduce motion artifacts.

2. The method of claim 1, wherein said collecting of said magnetic resonance signal is done by a pulse sequence according to a gradient echo technique.

3. A magnetic resonance signal collection method comprising the steps of:
    successively collecting magnetic resonance signals along a plurality of linear radial trajectories passing through center of a k-space;
    setting an angular difference between a first random trajectory and a next and random trajectory at 90°; and
    defining new random trajectories alternatively in two adjacent regions formed by dividing said k-space by said first and next random trajectories so that an angular difference between adjacent random trajectories is a repeatedly bisected angle in sequence thereby to reduce motion artifacts.

4. The method of claim 3, wherein said collecting of said magnetic resonance signals is done by a pulse sequence according to a gradient echo technique.

5. A magnetic resonance imaging method comprising the steps of:
    exciting spins of atomic nuclei within an imaged subject,
    collecting magnetic resonance signals generated by said spins in a plurality of view directions, and
    producing an image based on said collected magnetic resonance signals; wherein
        said magnetic resonance signals being collected successively along a plurality of linear radial trajectories passing through a center of a k-space; and wherein the order of selecting of said trajectories is randomized thereby to reduce motion artifacts.

6. The method of claim 5, wherein said collecting of said magnetic resonance signals in done by a pulse sequence according to a gradient echo technique.

7. A magnetic resonance imaging method comprising the steps of:
    exciting spins of atomic nuclei within an imaged subject,
    collecting magnetic resonance signals generated by said spins in a plurality of view directions,
    producing an image based on said collected magnetic resonance signals; wherein
        said magnetic resonance signals being collected successively along a plurality of linear radial trajectories passing through a center of a k-space;
    setting an angular difference between a first random trajectory and a next random trajectory at 90°; and
    defining new random trajectories alternately in two adjacent regions formed by dividing said k-space by said first and next random trajectories so that an angular difference between adjacent random trajectories is a repeatedly bisected angle in sequence thereby to reduce motion artifacts.

8. The method of claim 7, wherein said collecting of said magnetic resonance signals is done by a pusle sequence according to a gradient echo technique.

9. A magnetic resonance collecting apparatus comprising:
    means for successively collecting magnetic resonance signals along a plurality of linear radial trajectories passing through center of a k-space, and
    means for randomizing order of selecting of said trajectories thereby to reduce motion artifacts.

10. The apparatus of claim 9, wherein said means for collecting said magnetic resonance signals comprises means for providing pulse sequence according to a gradient echo technique.

11. A magnetic resonance signal collecting apparatus comprising:
    means for successively collecting magnetic resonance signals along a plurality of linear radial trajectories passing through center of a k-space;
    means for setting an angular difference between a first random trajectory and a next random trajectory at 90°, and means for defining new random trajectories alternately in two adjacent regions formed by dividing said k-space by said first and next random trajectories so that an angular difference between adjacent random trajectories is a repeatedly bisected a bisected angle in sequence thereby to reduce motion artifacts.

12. The apparatus of claim 11, wherein said means for collecting said magnetic resonance signals comprises means for applying a pulse sequence according to a gradient echo technique.

13. A magnetic resonance imaging apparatus comprising:

means for exciting spins of atomic nuclei within an imaged subject;

means for collecting magnetic resonance signals generated by said spins in a plurality of view directions;

means for producing an image based on said collected magnetic resonance signals;

said means for collecting comprising means for collecting said magnetic resonance signals successively along a plurality of linear radial trajectories through center of a k-space; and means for randomly selecting order of said trajectories thereby to reduce motion artifacts.

14. The apparatus of claim 13, further comprising:

means for setting an angular difference between a first random trajectory and a next random trajectory at 90°; and means for defining new random trajectories alternately in two adjacent regions formed by dividing said k-space by said first and next random trajectories so that an angular difference between adjacent random trajectories is a repeatedly bisected angle in sequence.

15. The apparatus of claim 13, wherein said means for collecting said magnetic resonance signals comprises means for providing a pulse sequence according to a gradient echo technique.

* * * * *